United States Patent [19]
Pohl

[11] Patent Number: 5,861,234
[45] Date of Patent: Jan. 19, 1999

[54] PHOTOPOLYMER USEFUL IN FABRICATING PRINTING PLATES WHICH ARE RESISTANT TO POLAR SOLVENT BASED INK

[75] Inventor: Rudolph Pohl, Wilmington, Del.

[73] Assignee: MacDermid, Incorporated, Waterbury, Conn.

[21] Appl. No.: 790,492

[22] Filed: Jan. 29, 1997

[51] Int. Cl.⁶ .................................. G03F 7/26; G03F 7/30

[52] U.S. Cl. ........................ 430/300; 430/284.1; 430/306

[58] Field of Search ..................................... 430/300, 306, 430/284.1

[56] References Cited

U.S. PATENT DOCUMENTS

| | | | |
|---|---|---|---|
| 3,558,387 | 1/1971 | Bassemir et al. | 156/99 |
| 3,960,572 | 6/1976 | Ibata et al. | 96/115 P |
| 5,658,708 | 8/1997 | Kondo | 430/288.1 |

*Primary Examiner*—Cynthia Hamilton
*Attorney, Agent, or Firm*—John L. Cordani

[57] ABSTRACT

The addition of vinyl ethers to photosensitive resins is suggested to improve the resistance of the cured resin to polar solvents. Long chain vinyl ethers such as octadecyl vinyl ether or dodecyl vinyl ether are preferred. The resulting photosensitive resin compositions are particularly useful in the fabrication of printing plates.

10 Claims, No Drawings

PHOTOPOLYMER USEFUL IN FABRICATING PRINTING PLATES WHICH ARE RESISTANT TO POLAR SOLVENT BASED INK

BACKGROUND OF THE INVENTION

This invention relates to liquid polymer compositions which are useful in the manufacture of imaged printing plates and coatings through photopolymerization. Photocurable compositions useful in forming printing plates and coatings, in general, are well known in the art. In particular U.S. Pat. No. 2,760,863 (Plambeck) describes the use of certain photopolymers in the fabrication of printing plates. However, the processes of Plambeck require the use of relatively toxic solvents to develop away the unpolymerized photopolymer thereby revealing the relief image of the printing plate.

U.S. Pat. Nos. 3,960,572; 4,137,081; 4,442,302; and 4,857,434, the teaching each of which are included herein by reference in their entirety, reveal certain improvements to the processes of Plambeck. One of the most notable improvements of the foregoing disclosures is that the photopolymers utilized can be developed, after selective polymerization with light, in aqueous based solutions. Aqueous developable photopolymers of the foregoing type are currently marketed under the Merigraph trade name by MacDermid Imaging Technology, Inc. of Wilmington, Del. These aqueous developable photopolymers are useful in printing a variety of substrates including paper, cardboard and plastic, due to the fact that they are capable of forming printing plates having the necessary hardness, flexibility, resilience, and abrasion resistance required for such printing.

The liquid photopolymers currently known and utilized are generally useful in printing with aqueous based inks only. They are not useful in printing with polar organic solvent based inks, such as alcohol based inks, because the cured polymers do not possess the necessary resistance to polar solvents. When exposed to polar solvent based inks cured liquid photopolymers generally degrade or swell to an unacceptable degree, making their usefulness in printing these inks much less than desirable.

In a variety of applications, such as film printing, it is necessary or desirable to print with polar solvent based inks. The solvents used in such inks may be one or a mixture of commonly used organic solvents, such as isopropyl alcohol and n-propyl acetate. In any case, liquid photopolymers, such as those described above, have not possessed the necessary resistance to these polar solvents and thus are not useful in fabricating printing plates for these applications.

It is therefore an object of this invention to reveal liquid photopolymer compositions which produce printing plates which are resistant to a variety of inks, including water based, alcohol based and hydrocarbon based inks. The printing plates produced using the compositions of this invention are therefore useful in a wide variety of printing applications.

It is a further object of this invention to reveal liquid photopolymer compositions which produce printing plates having the hardness, flexibility and abrasion resistance which is necessary for printing in a variety of applications. Thus the photopolymer compositions of this invention are capable of producing high quality artwork using a wide variety of inks and on various types of surfaces.

SUMMARY OF THE INVENTION

The inventor here has discovered that the incorporation of vinyl ethers, particularly long chain vinyl ethers such as octadecyl vinyl ether or dodecyl vinyl ether, into polyurethane photopolymers produces an improved photopolymer with increased resistance to solvents after photopolymerization. As noted previously, these characteristics are particularly useful in the fabrication of printing plates for use in printing polar solvent based inks.

The addition of vinyl ethers improves the solvent resistance of polymerized polyurethane photopolymers generally. However, the inventor has found that for the purpose of preparing printing plates, it is preferable to add the vinyl ethers to a polyurethane photopolymer based on polyesters, polyethers, polybutadienes, hydrogenated polybutadienes, polyisoprenes, hydrogenated polyisoprenes, copolymers of butadiene with styrene or combinations of the foregoing.

DETAILED DESCRIPTION OF THE INVENTION

The liquid photopolymer compositions of the present invention are useful in preparing printing plates which have good resistance to polar solvent based inks as well as the requisite hardness, flexibility and resilience for effective, high quality printing on a variety of substrates. The photosensitive resins of the present invention provide photopolymer printing plates which have a shore A hardness between 20 and 90 on the shore A scale at 20° C. and a solvent swell (a typical measure of solvent resistance) of 5–15 wt. % or lower in a solution of 15% by weight n-propyl acetate and 85% isopropanol (a common ink solvent) for 24 hours. Properties in these ranges render said plates useful for printing on plastic film, as well as other types of substrates, in a flexographic printing process. The plates produced are also capable of effectively printing with water, alcohol or other solvent based printing inks.

The liquid photopolymer composition of the current invention comprises:

A). at least one ethylenically unsaturated polyurethane prepolymer;

B). at least one vinyl ether;

C). at least one photoinitiator;

D). at least one ethylenically unsaturated monomer.

The polyurethane prepolymer of the current invention can be prepared by reacting an excess of a diisocyanate with a diol, such as a polybutadiene diol, a polyester diol, a polyether diol, a polyisoprene diol, diols of butadiene/styrene copolymers or mixtures of the foregoing. The foregoing reaction of the diol, or the indicated mixtures with an excess of diisocyanate will form an isocyanate terminated polyurethane oligomer. Other ingredients, such as the ethylenically unsaturated monomer(s), acetic acid or solvents, may be added to the reactant mixture to adjust the viscosity thereof. The diisocyanate used can be aromatic or aliphatic diisocyanates, but aromatic diisocyanates are preferred. Suitable aliphatic diisocyanates include trimethyl hexamethylene diisocyanate and biscyclohexylmethylene diisocyanate. Preferred aromatic diisocyanates include toluene diisocyanate and methylene diphenyl diisocyanate.

The oligomer is then further reacted with a hydroxyacrylate, hydroxy methacrylate or mixtures thereof to form the ethylenically unsaturated polyurethane prepolymer. Suitable hydroxy acrylates or methacrylates include: hydroxypropyl methacrylate, polypropylene glycol monomethacrylate, and acrylated caprolactone oligomers. Polypropylene glycol monomethacrylate, hydroxypropyl methacrylate, or a mixture of the foregoing are preferred.

The ethyleneically unsaturated polyurethane prepolymer formed by the foregoing reactions can be described by the following:

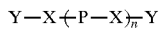

Wherein each P of each P-X repeating unit is independently selected from the group consisting of polybutadienes, hydrogenated polybutadienes, polyesters, polyethers, polyisoprenes, hydrogenated polyisoprenes and copolymers of butadiene with styrene. (note that the starting raw reactants for P are hydroxy terminated polybutadienes, hydroxy terminated polyesters, and hydroxy terminated polyethers, hydroxy terminated polyisoprenes, hydroxy terminated hydroginated polyisoprenes, and hydroxy terminated copolymers of butadiene with styrene. Further note that as used herein and in the claims each P in the structure noted above contains the terminal oxygens remaining from the hydroxy termination);

Wherein X is selected from the group consisting of aromatic diisocyanates and aliphatic diisocyanates;

Wherein Y is a terminal group which has an ethylenically active portion at the outer end of the group. Preferably said terminal group is an acrylate, a methacrylate, of mixtures thereof (note that the raw reactants are hydroxy acrylates or hydroxy methacrylates) most preferably polypropylene glycol monomethacrylate; and wherein n is an integer of from 1 to 20.

In order to produce an ethylenically unsaturated polyurethane prepolymer having the appropriate viscosity for manufacturing of flexographic printing plates, and to produce printing plates having the appropriate hardness, tensile strength and elongation, it is preferred to begin with diols having a molecular weight from 500 to 5,000, more preferably between 2,000 and 4,500 and most preferably greater than 3,000.

The vinyl ethers useful in the composition of the instant invention can be any vinyl ether, however, the inventor has found that long chain vinyl ethers are preferable. Vinyl ethers with molecular weights in the range of 100 to 400 are preferable, and molecular weights in the range of 150 to 300 are most preferred. A variety of suitable vinyl ethers are available from the BASF Company. Long chain vinyl ethers, such as octadecyl vinyl ether and/or dodecyl vinyl ether are particularly preferred. The inventor has found the incorporation of such vinyl ethers into the photopolymer composition significantly increases the resistance of the cured polymer to polar solvents, thereby reducing the swell of the cured polymer when used in contact with polar solvents such as water or a solution of 85% isopropyl alcohol and 15% n-propyl acetate (typical polar solvents used in ink formulations).

The vinyl ethers can be advantageously incorporated into the photopolymer composition at concentration ranging from 0.5 to 20 weight percent. The inventor has found that concentrations of 2 to 10 weight percent of vinyl ethers in the photopolymer composition are particularly advantageous.

In addition to the ethylenically unsaturated polyurethane prepolymer and the vinyl ethers, the photopolymer resins of the current invention also comprise at least one ethylenically unsaturated monomer and at least one photoinitiator. The ethylenically unsaturated monomer may be any commonly available acrylate or methacrylate such as isobornyl ester, t-butyl ester, laurylester, monoesters or diesters of acrylic acid or methacrylic acid, and/or triesters of trimethylopropanol or propoxylated trimethylolpropanol. However, the use of a monomer having two or more ethylenically unsaturated groups in the monomer increases the hardness of the resultant printing plate. Thus the amount of monomers with two or more ethylenically unsaturated groups in the monomer increases the hardness of the resultant printing plate. Therefore the amount of monomers with two or more ethylenically unsaturated groups should be controlled such that a printing plate with the desired hardness is the result.

It is preferred that the ethylenically unsaturated monomer comprise a mixture of monomers with some having one ethylenically unsaturated group and some having two or more ethylenically unsaturated groups. The optimum ratio of the mixture will be determined by the desired hardness of the resulting printing plate. The amount of the monomer or monomer mixture will have an effect on the viscosity of the photosensitive resin. The greater the amount of the monomer or monomer mixture, the lower the resultant viscosity of the photosensitive resin. The viscosity of the photosensitive resin is preferably between 5,000 cps and 200,000 cps at room temperature and more preferably between 10,000 cps and 50,000 cps.

Any commonly used photopolymerization initiator customarily used in similar photosensitive resin compositions will be suitable. Specifically, ethers, such as benzoin ether and/or acetophenone and its derivatives are commonly used as photopolymerization initiators. One particularly preferred initiator is 2,2-dimethoxy-2-phenylacetophenone. The amount of the initiator can be any effective concentration which will allow the formation of a base layer to the flexographic printing plate via a back exposure of a reasonable length of time, and the formation of a relief image with the required resolution. The effective amount of photopolymerization initiator will depend upon the initiator chosen and the desired thickness of the resultant printing plate. For 2,2-dimethoxy-2-phenylacetophenone, an effective concentration is between 0.1% and 3.0% by weight in the photopolymer resin, most preferably between 0.3% and 1.5% by weight.

In addition to all of the above the photosensitive resin compositions of the current invention may also, optionally, comprise slip additives, dyes, stabilizers and other additives of a similar nature which are typically added to photosensitive resin compositions.

The following examples are given as illustrative of the current invention but should not be taken as limiting:

EXAMPLE 1

12.7 g of octadecyl vinyl ether (BASF) was added to 252.0 g of Merigraph F025-3 resin and stirred at room temperature for one hour. Merigraph® F025-3 resin is a polyether urethane based resin manufactured by MacDermid Imaging Technology, Inc. of Wilmington, Dela. The sample was placed in a 60° oven for three hours and then centrifuged to remove air bubbles. The liquid resin was clear and free from haze.

The cured sample was prepared by doctoring out a thickness of 40 mils of resin between a 4 mil polyester film and a 0.75 mil polypropylene film. It was then cured by exposure to ultraviolet light from a medium pressure mercury lamp and UV fluroescent tubes. The exposure time was 30 seconds through the top of the sample and 400 seconds through the bottom of the sample. The UV intensity at 365 nm was 3.5 mw/cm² on the top and 4.7 mw/cm² on the bottom. Dumbbells were cut from the cured 40 mil thick film and mechanical properties and swell test run. The swell test measures the % weight gain after soaking in the solvent for 24 hours. Comparison of the samples containing octadecyl vinyl ether and a sample without the octadecyl vinyl ether as shown below:

|   | wt %<br>octadecyl<br>vinyl ether | Tensile<br>strength<br>psi | Elongation<br>% | Hardness<br>Shore A | Bayshore<br>resilience | % Swell in 24 hours | |
|---|---|---|---|---|---|---|---|
|   |   |   |   |   |   | Water | 80% Water<br>20% Isopropyl<br>alcohol |
| 1 | 0 | 746 | 265 | 26 | 35 | 9.7 | 23.9 |
| 2 | 4.8 | 616 | 257 | 24 | 39 | 8.2 | 20.8 |

Vinyl ethers are especially useful in polyurethane resins based on hydrogenated polybutadiene. These resins are designated to be used with polar solvent containing flexographic inks which typically contain alcohols and propyl acetate. The vinyl ether containing formulation swells less in these solvents. The following example illustrates the use of vinyl ethers in this type of formulation.

EXAMPLE II

To a mixture of 2500 g of hydroxyl terminated hydrogenated polybutadiene (Shell Chemical Co., equivalent weight=1753) 7.5 g of butylated hydroxy toluene, 6.25 g of acetic acid, 250 g of isodecyl methacrylate and 25 g of myristic acid was added 161.5 g of 2,4 toluene diisocyanate. The resulting mixtures was stirred at 55° C. for 80 minutes to form an isocyanate terminated polyurethane polymer. Then 374 g of polypropylene glycol monomethacrylate along with 0.02 g of dibutyl tin dilaurate was added and the reaction stirred for an additional 150 minutes at 69° C. At this point, no isocyanate could be detected by titration with dibutyl amine. The resulting methacrylate terminated polymer had a Brookfield viscosity of 108,200 cps at 60° C.

Photosensitive resin compositions were then made by blending this prepolymer with methacrylate monomers, vinyl ethers and a photoinitiator and stirring as described in Example 1. The compositions and properties of these formulations is summarized in Tables 1, 2, and 3. Cured samples 40 mils thick were then prepared as described in Example 1. Concentrations noted in the tables are in parts by weight.

The results clearly demonstrate that additions of a vinyl ether to the photosensitive resin increase the resistance of the cured photosensitive resin to polar solvents.

TABLE 1

| Ingredients: | 66 | 66 | 66 | 66 | 66 | 71 |
|---|---|---|---|---|---|---|
| Prepolymer |   |   |   |   |   |   |
| LMA[1.] | 27.5 | 23 | 19 | 13.8 | 12.5 | 12.8 |
| TMPTMA[2.] | 3.4 | 3.4 | 3.4 | 3.4 | 3.4 | 3.7 |
| VODE[3.] | — | 4.3 | 8.6 | 12 | 14.6 | 9.2 |
| DDVE[4.] |   |   |   |   |   |   |
| IBOMA[5.] |   |   |   |   |   |   |
| DMPAP[6.] |   |   |   |   |   |   |
| Lauric Acid |   |   |   |   |   |   |
| Myristic Acid |   |   |   |   |   |   |
| Properties |   |   |   |   |   |   |
| Tensile (Psi): | 1316 | 1260 | 1160 | 975 | 910 | 1090 |
| % Elong. | 170 | 178 | 177 | 167 | 169 | 174 |
| Shore A | 51/48 | 49/47 | 46/45 | 45/43 | 43/42 | 48/46 |
| Resilience | 30 | 34 | 36 | 40 | 44 | 41 |
| Swell w/SUB | 13 | 11 | 9 | 6 | 4 |   |
| Visc @ 25° C. | 40,700 | 39,700 | 44,000 | 42,400 | 36,300 | 79,000 |

[1.]Lauryl Methacrylate
[2.]Trimethylol propane trimethacrylate
[3.]Octadecyl vinyl ether
[4.]Dodecyl vinyl ether
[5.]Isobornyl methacrylate
[6.]2,2 - dimethyloxy - 2-phenylacetylphenone

TABLE 2

| Ingredients: | 61 | 61 | 58 | 54 | 54 | 54 | 54 |
|---|---|---|---|---|---|---|---|
| Prepolymer |   |   |   |   |   |   |   |
| LMA | 21 | 20 | 24 | 28 | 26 | 24 | 22 |
| TMPTMA | 3.0 | 4.0 | 4.0 | 4.0 | 4.0 | 4.0 | 4.0 |
| VODE |   |   |   |   |   |   |   |
| DDVE[2.] | — | — | — | — | 2.0 | 4.0 | 6.0 |
| IBOMA |   |   |   |   |   |   |   |
| DMPAP | 1.3 | 1.3 | 1.3 | 1.3 | 1.3 | 1.3 | 1.3 |
| Lauric Acid | 1.2 | 1.2 | 1.2 | 1.2 | 1.2 | 1.2 | 1.2 |
| Myristic Acid | 1.2 | 1.2 | 1.2 | 1.2 | 1.2 | 1.2 | 1.2 |
| Isodecyl MA(SR-242) | 11 | 11 | 10 | 10 | 10 | 10 | 10 |

TABLE 2-continued

| Ingredients: | 61 | 61 | 58 | 54 | 54 | 54 | 54 |
|---|---|---|---|---|---|---|---|
| Properties: | | | | | | | |
| Tensile (Psi) | 1250 | 1270 | 1317 | 1310 | 1261 | 1108 | 1061 |
| % Elong. | 240 | 217 | 212 | 204 | 180 | 185 | 181 |
| Shore A | 43/39 | 48/44 | 48/45 | 48/44 | 50/46 | 46/43 | 44/41 |
| Resilience | 29 | 30 | 28 | 26 | 30 | 32 | 34 |
| Swell | 11 | 11 | 11 | 11 | 1o | 9 | 8 |
| Visc @ 25° C. | 77,800 | 73,200 | 49,500 | 32,700 | 32,000 | 32,100 | 26,600 |

TABLE 3

| Ingredients: | 60 | 60 | 60 | 60 | 60 |
|---|---|---|---|---|---|
| Prepolymer | | | | | |
| LMA | 32.3 | 30.3 | 28.3 | 27.3 | 25.3 |
| TMPTMA | 4.0 | 4.0 | 4.0 | 5.0 | 5.0 |
| VODE | — | — | — | — | — |
| DDVE | — | 2.0 | 4.0 | 4.0 | 6.0 |
| IBOMA | | | | | |
| DMPAP | 1.3 | 1.3 | 1.3 | 1.3 | 1.3 |
| Lauric Acid | 1.2 | 1.2 | 1.2 | 1.2 | 1.2 |
| Myristic Acid | 1.2 | 1.2 | 1.2 | 1.2 | 1.2 |
| Properties: | | | | | |
| Tensile (Psi) | 1110 | 1036 | 985 | 1053 | 939 |
| % Elong. | 191 | 170 | 176 | 151 | 147 |
| Shore A | 43/39 | 44/40 | 42/38 | 49/45 | 46/43 |
| Resilience | 28 | 31 | 32 | 34 | 34 |
| Swell | 11 | 10 | 9 | 8 | 7 |
| Visc @ 25° C. | 41,000 | 39,800 | 40,600 | 39,900 | 41,000 |

I claim:

1. A process for fabricating a printing plate, said process comprising:
   a). selectively contacting a photosensitive resin composition comprising:
      1). at least one ethylenically unsaturated polyurethane prepolymer;
      2). at least one vinyl ether;
      3). at least one photoinitiator; and
      4). at least one ethylenically unsaturated monomer; with actinic radiation; and
   b). developing away the unpolymerized photosensitive resin;
   wherein the prepolymer, the vinyl ether, the photoinitiator and the monomer are separate distinct ingredients prior to contacting the resin composition with actinic radiation.

2. A process according to claim 1 wherein the vinyl ether has a molecular weight in the range of 100 to 400.

3. A process according to claim 1 wherein the vinyl ether is selected from the group consisting of octadecyl vinyl ether and dodecyl vinyl ether.

4. A process according to claim 1 wherein the concentration of the vinyl ether is from 0.5 to 20 weight percent.

5. A process according to claim 1 wherein the ethylenically unsaturated monomer comprises a mixture of monomers having one ethylenic group and monomers having more than one ethylenic group.

6. A process for fabricating a printing plate, said process comprising:
   a). selectively contacting a photosensitive resin composition comprising:
      1. at least one ethylenically unsaturated polyurethane prepolymer;
      2. at least one vinyl ether;
      3. at least one photoinitiator; and
      4. at least one ethylenically unsaturated monomer; with actinic radiation; and
   b). developing away any unpolymerized photosensitive resin;
   wherein the ethylenically unsaturated polyurethane prepolymer is the reaction product of X, Y, and P and wherein the prepolymer has the following structure:

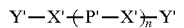

wherein P is selected from the group consisting of polybutadienes, hydrogenated polybutadienes, polyesters, polyethers, polyisoprenes, hydrogenated polyisoprencs, copolymers of butadiene with styrene, and mixtures of the foregoing; wherein X is selected from the group consisting of aromatic diisocyanates, aliphatic diisocyanates, and mixtures thereof; and wherein Y is selected from the group consisting of acrylates, methacrylates, and mixtures thereof; wherein n is an integer of from 1 to 20; and wherein P', X' and Y' are the reaction residues of P, X and Y respectively.

7. A process according to claim 6 wherein the vinyl ether has a molecular weight in the range of 100 to 400.

8. A process according to claim 6 wherein the vinyl ether is selected from the group consisting of octadecyl vinyl ether and dodecyl vinyl ether.

9. A process according to claim 6 wherein the concentration of the vinyl ether is from 0.5 to 20 weight percent of said photosensitive resin composition.

10. A process according to claim 6 wherein each P' of each P'–X' repealing unit is independently selected from the reaction product of P wherein P is selected from the group consisting of hydrogenated polybutadienes, hydrogenated polyisoprenes, and copolymers of hydrogenated butadiene with styrene.

* * * * *